(12) United States Patent
Veress et al.

(10) Patent No.: US 8,298,637 B2
(45) Date of Patent: Oct. 30, 2012

(54) PHOTOPOLYMER ASSEMBLY

(75) Inventors: Alexander R. Veress, Piscataway, NJ (US); Erik E. Roessner, Robbinsville, NJ (US); Colin J. Brunton, Rutland (GB)

(73) Assignee: Trodat GmbH (AT)

( * ) Notice: Subject to any disclaimer, the term of this patent is extended or adjusted under 35 U.S.C. 154(b) by 550 days.

(21) Appl. No.: 12/537,672

(22) Filed: Aug. 7, 2009

(65) Prior Publication Data

US 2010/0035002 A1    Feb. 11, 2010

Related U.S. Application Data

(60) Provisional application No. 61/188,251, filed on Aug. 7, 2008.

(51) Int. Cl.
*B29C 65/00* (2006.01)
(52) U.S. Cl. ....................................................... 428/35.5
(58) Field of Classification Search .................. 428/35.5
See application file for complete search history.

(56) References Cited

U.S. PATENT DOCUMENTS

| 4,999,266 | A  | * | 3/1991 | Platzer et al. .................... 430/14 |
| 6,737,219 | B2 | * | 5/2004 | Holt et al. ..................... 430/281.1 |
| 2003/0039915 | A1 | * | 2/2003 | Holt et al. ..................... 430/270.1 |
| 2010/0035002 | A1 | * | 2/2010 | Veress et al. .................. 428/35.5 |

FOREIGN PATENT DOCUMENTS

EP    0607106 A1    7/1994
JP    60-141148 A    7/1985

* cited by examiner

*Primary Examiner* — N. Edwards
(74) *Attorney, Agent, or Firm* — Lerner, David, Littenberg, Krumholz & Mentlik, LLP

(57) ABSTRACT

The invention relates to an element, in particular a photopolymer unit, with a rear layer and a top layer which are joined to one another to form a sealed bag in which a precursor of a plastic which can be polymerised with electromagnetic radiation is contained, in particular a photopolymer. The top layer is made from a cast plastic. The invention further relates to the production of a printing plate from this element.

8 Claims, 2 Drawing Sheets

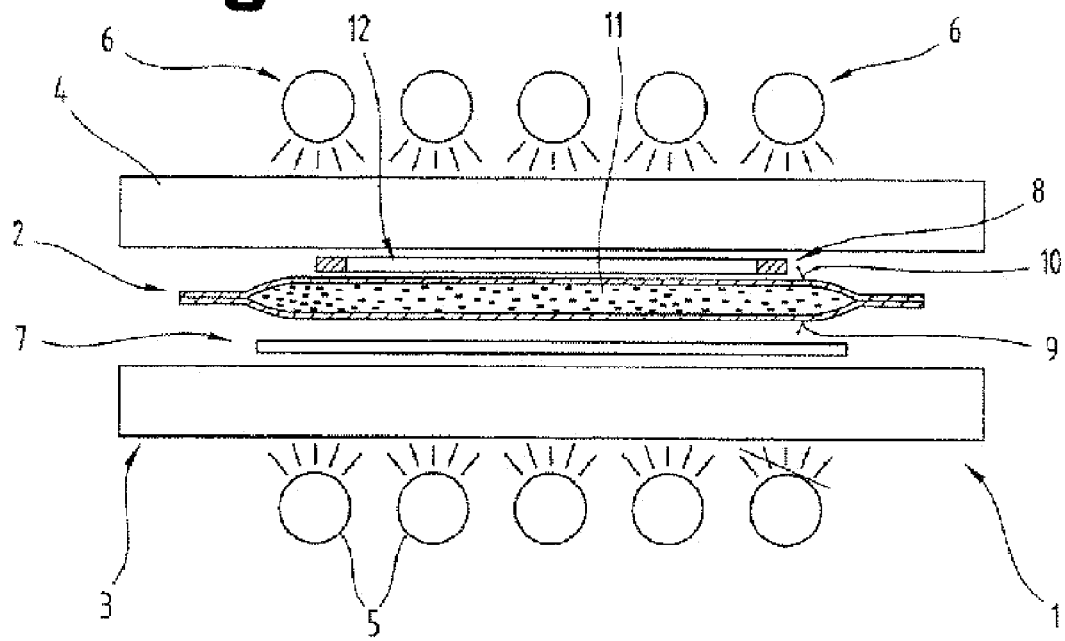
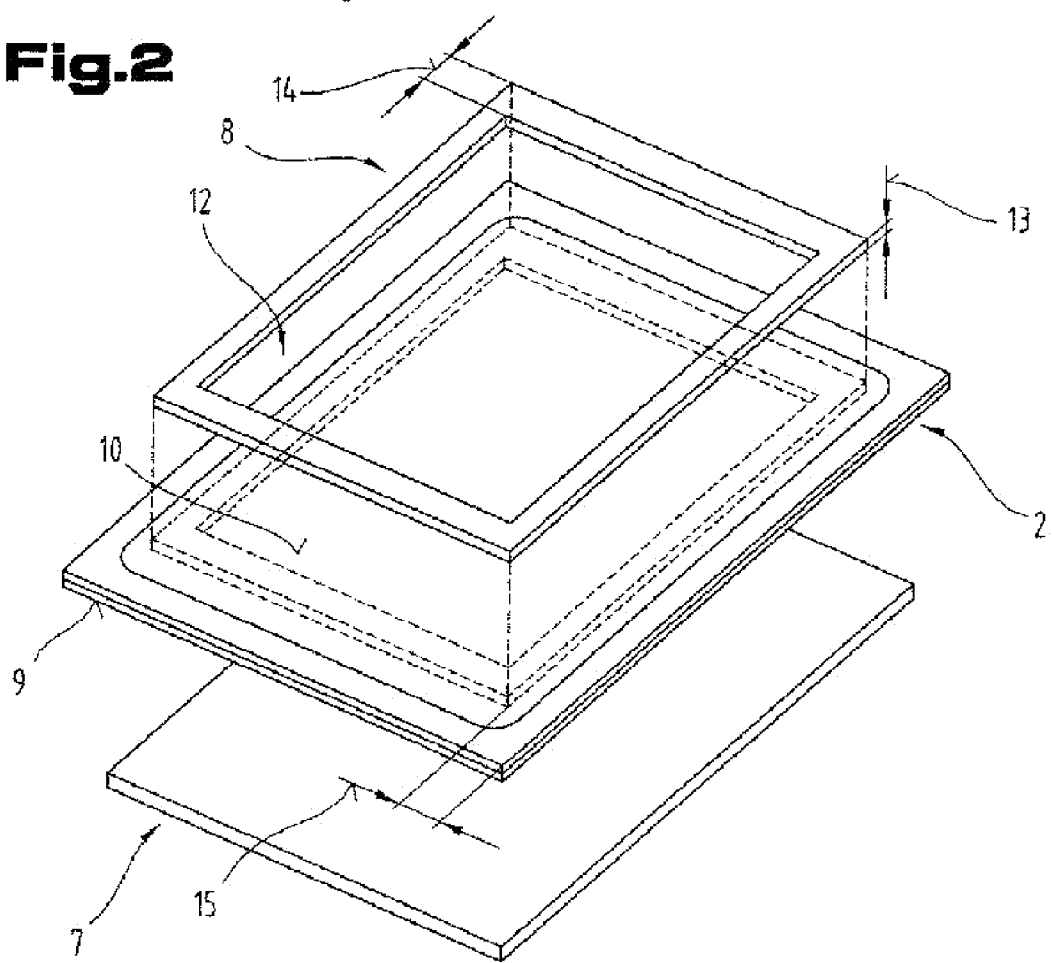

PHOTOPOLYMER ASSEMBLY

CROSS-REFERENCE TO RELATED APPLICATIONS

This application claims the benefit of the filing date of U.S. Provisional Patent Application No. 61/188,251 filed Aug. 7, 2008, the disclosure of which is hereby incorporated herein by reference.

BACKGROUND OF THE INVENTION

The invention relates to an element, in particular a photopolymer unit, with a rear layer and a top layer which are joined to one another to form a closed bag in which a precursor of a plastic which can be polymerised by electromagnetic radiation is contained, in particular a photopolymer, a method of producing a printing plate for a stamp with a surface provided with a relief pattern using an element with a top layer and a rear layer which are joined to one another to form a closed bag in which a precursor of a plastic which can be polymerised by electromagnetic radiation is contained, and a device for producing a printing plate for a stamp with a relief pattern which comprises a production apparatus with two plates which are transparent to light in particular, and at least one radiation source for emitting electromagnetic radiation, in particular at least one UV light source.

The production of printing plates or text plates of stamps involving the selective curing of light-cured liquid or pasty plastics under the effect of radiation is already known from the prior art. To this end, the liquid photopolymer (prepolymer) is enclosed in a bag made from a thin transparent plastic film. Two sheets are usually welded to one another at their edges to obtain a polymer unit in the form of a flat bag. To enable a printing plate for a stamp to be produced from such a polymer unit or polymer pack, the polymer unit together with a mask—usually in the form of a photographic negative—are placed between two parallel glass plates of an appropriate production or lighting apparatus, and the mask lies between the bottom transparent plate and the polymer unit. A continuous base layer is formed due to the effect of radiation from above and curing of the polymer is induced as a result, and a relief-type structure corresponding to the shape of the mask and joined to the base layer is formed due to the effect of radiation from underneath. Once the photopolymer unit subjected to radiation treatment and cured in this manner is removed from the lighting apparatus, the cured plate is released from the bag and the non-cured prepolymer is washed off the non-illuminated areas. Such methods of producing these photopolymer units for producing printing plates for stamps are already known from JP 60141148 A (Maeda et al.) and EP 0 607 106 A1 (De Caria).

US 2003/0039915 A1 (Holt) discloses photopolymer packs for producing printing plates for stamps and the films used to make the bag of the photopolymer bags is made from a material which can be detached from the cured polymer. This being the case, the material of the films specifically contains polyolefins. Also disclosed by this document is the fact that laminates of polyethylene and polyethylene terephthalate are used for the films.

Another aspect which is known about the prepolymer packs known from the prior art is that when producing printing plates with the described method, the quality is very often detrimentally affected by irregularities or deformations in the contours of the relief pattern of the printing plates. A major reason for this appears to be the fact that the films used have a tendency to form creases as they are placed in the lighting apparatus and creases tend to form when the bag is being produced from the two films, e.g. by welding, especially if the two films are made from different polymers with different heat expansion properties.

BRIEF SUMMARY OF THE INVENTION

Accordingly, the underlying objective of this invention is to propose one possibility of producing a printing plate by means of which a greater accuracy of the printing pattern can be achieved.

This objective is achieved, independently in each case, by the element outlined above in which the top layer is made from a cast plastic, by the method involving the methods steps of (1) placing the element between two parallel plates, (2) placing an intermediate piece on the element, (3) compressing the element and the intermediate piece between the two plates, (4) irradiating the precursor of the element with electromagnetic radiation so that it is polymerised to form a polymer as the printing plate is formed, and the intermediate piece assists in producing an at least more or less smooth surface of the polymer, and by the device comprising an intermediate piece which is placed between the plates together with an element, in particular a photopolymer unit, and compressed, and the element is provided in the form of a bag with a liquid or gel-type polymerisable precursor of a plastic contained in it, in particular a photopolymer.

Surprisingly, it has been found that an improvement in transparency for light and a clearly improved resolution of the fonts (scripture) on the printing plate can be achieved, if the top layer is not produced from an extruded plastic film but from a cast plastic film. Cast plastic films can have the tendency to form creases, in particular cast plastic films with a small thickness. However, the tendency for creases to form can also be reduced by using an intermediate piece due to the fact that, because the intermediate piece is placed on the top layer, the latter, disposed at least more or less parallel with the plates between which the element is disposed, is clamped across at least a major part of the surface due to the compression of the plates. Reducing creases enables more uniform lighting to be obtained because the proportion of scattered light can be reduced and the thickness of the film to be illuminated is at least more or less uniform across the entire surface, which means that the relief-type printing pattern which can be created on the printing plate to be produced has a higher accuracy and the surface in the region of the printing pattern can also be made smoother, which in turn results in positive properties of the printed image which can be produced by the printing plate.

The rear layer of the unit may contain at least one polyester since this will mean that the rear layer remains adhered to the printing plate, even after it has been produced. This makes the printing plate easier to handle.

In order to improve this effect of adhesion, the rear layer in one embodiment has a coating of a polymer substance which is in direct contact with the precursor, and the coating assists the adhesion of the rear layer to the plastic forming the precursor.

It has proved to be of particular advantage to use a PVC-PVA copolymer (polyvinyl chloride-polyvinyl acetate copolymer) as the polymer substance of the coating.

The cast plastic of the top layer (9) is preferably a cast PVC. This results in a very high transparency of the top layer, enabling the accuracy of the printing plate in the region of the relief-type structure to be improved still further.

An improvement in the quality of the printed image can be achieved by more uniform lighting if the rear layer has a thickness selected from a range with a lower limit of 25 μm and an upper limit of 150 μm and/or if the top layer has a thickness selected from a range with a lower limit of 15 μm and an upper limit of 125 μm.

To improve the resultant effects still further, the rear layer may in particular have a thickness selected from a range with a lower limit of 50 μm and an upper limit of 100 μm, or a range with a lower limit of 50 μm and an upper limit of 80 μm, and the top layer has a thickness selected from a range with a lower limit of 25 μm and an upper limit of 60 μm or a range with a lower limit of 25 μm and an upper limit of 60 μm or a range with a lower limit of 25 μm and an upper limit of less than 50 μm.

In one embodiment of the method, the step of placing the intermediate piece on the element involves placing a closed frame with an open central region above the element, as a result of which the tension applied to the element, in particular the rear layer, can be kept uniform. Also as a result, surplus polymer, i.e. the liquid or gel-type or pasty precursor, can escape through this central region via the plates under the pressing action. For the latter purpose, there is another option, which may also be used in addition, whereby the frame has appropriate cut-outs or orifices, for example horizontally running orifices extending through the frame.

It is preferable if a mask in the form of a negative, in particular a negative film, is disposed between the element and one of the two plates because this means that when the plates are pressed together, this mask is oriented at least more or less parallel with the element and/or at least more or less flat.

For reasons of transparency, the parallel plates are made from glass in particular and at least one electromagnetic radiation source is disposed above and underneath the plates respectively so that the radiation is transmitted at least through a part of a glass plate and at least through a part of the mask before the precursor of the plastic is illuminated. This makes the radiation introduced through the plates more even.

As explained above, the intermediate piece, in particular the frame-shaped mask, is preferably disposed in a plane extending parallel with the surface of the element.

To provide a clearer understanding of the invention, it will be explained in more detail with reference to the appended drawings.

BRIEF DESCRIPTION OF THE DRAWINGS

These are respectively highly schematic, simplified diagrams illustrating:

FIG. 1 is a detail of a device for applying a radiation treatment to an element proposed by the invention;

FIG. 2 is a perspective view of an element with a mask and the frame-shaped intermediate piece;

DETAILED DESCRIPTION

Figure 3:
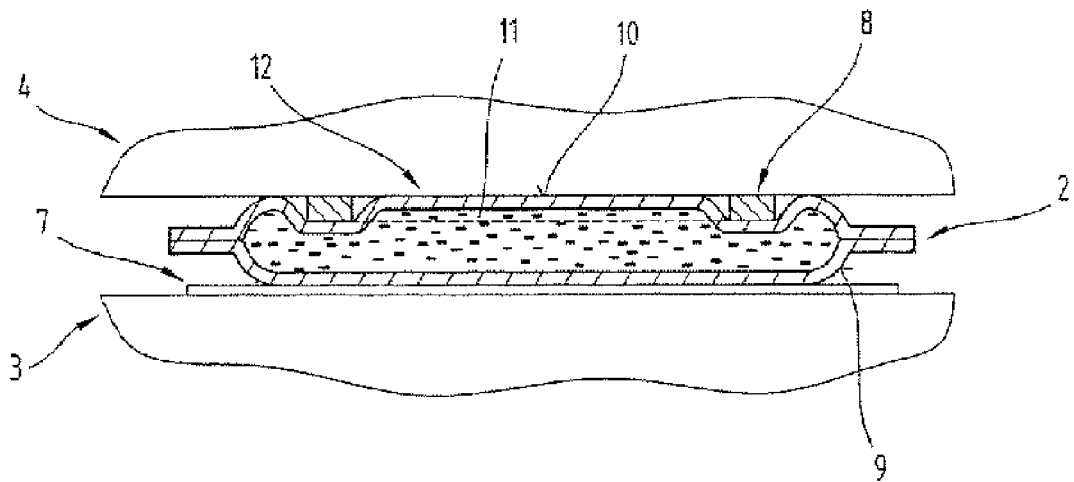
FIG. 3 is a cross-section of the element together with the intermediate piece clamped between the plates of the device.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc., relate to the drawing specifically being described and can be transposed in terms of meaning to a new position when another position is being described.

All the figures relating to ranges of values in the description should be construed as meaning that they include any and all part-ranges, in which case, for example, the range of 1 to 10 should be understood as including all part-ranges starting from the lower limit of 1 to the upper limit of 10, i.e. all part-ranges starting with a lower limit of 1 or more and ending with an upper limit of 10 or less, e.g. 1 to 1.7, or 3.2 to 8.1 or 5.5 to 10.

FIG. 1 shows a detail of a production apparatus 1 for applying a radiation treatment to an element 2, in particular a photopolymer unit.

The production apparatus 1 firstly comprises a bottom and a top transparent plate 3, 4, which may of glass or transparent plastic plates. Disposed underneath the bottom plate 3 and also above the top plate 4 respectively are radiation sources for emitting electromagnetic radiation, in particular light sources 5, 6, which are preferably provided in the form of UV lamps. The mask 7, which is preferably provided in the form of a photographic negative but may also be any other appropriate form of negative that would enable a relief-type structured surface of a printing element, in particular a printing plate, to be produced, lies on the bottom plate 3. The element 2 then lies on the mask 7. Disposed between the element 2 and the top plate 4, finally, is an intermediate piece 8.

The type of negative may be one known from the prior art.

The photopolymer unit 2 has the shape of a flat bag and is made up of a top layer 9 and a rear layer 10 of transparent plastic films. Disposed between the top layer 9 and the rear layer 10, which are welded or adhered to one another at their outer edges, is a liquid or gel-type or pasty precursor of a plastic, which can be polymerised by the effect of electromagnetic radiation, optionally with the aid of polymerising agents such as radical formers. The precursor may comprise monomer units or oligomer or prepolymer units which have already been partially pre-polymerised. It is preferably a so-called photopolymer 11, which can be polymerised, i.e. cured, with the aid of light, for example UV and/or visible light. However, it would also be possible to use other precursors which can be polymerised by means of other electromagnetic radiation, e.g. laser radiation, electron radiation, heat radiation, etc., and combinations of these are also possible as well. Since these precursors are already known from the prior art and the process of polymerisation by means of electromagnetic radiation is also known from the prior art, any further information in connection with the production of the printing plates may be gleaned from the relevant literature, for example the prior art documents mentioned above.

The rear layer 10 is preferably adapted so that it remains adhered to the cured, solid (photo)polymer and the top layer 9 is preferably adapted so that it can be detached from the cured (photo) polymer.

For reasons of clarity, the plates 3, 4, mask 7, element 2, in other words the photopolymer unit, and the intermediate piece 8 are shown in an exploded diagram, spaced apart from one another in FIG. 1. Prior to starting the operation of illuminating the element 2, the two plates 3, 4 are moved towards one another so that the mask 7, element 2 and intermediate piece 8 are pressed against one another and the element 2 is thus retained between the plates 3, 4 by mechanical tension. In the embodiment illustrated as an example, the intermediate piece 8 is in the shape of a rectangular frame with an open central region 12, as may be seen from FIG. 2.

In FIG. 2, the mask 7, element 2 and the intermediate piece 8 provided in the form of a frame are shown offset in the vertical direction. The external dimensions of the intermediate piece 8 relative to the external dimensions of the element 2, likewise rectangular, are such that the frame of the intermediate piece 8 sits in contact with and inside the outer edge of the element 2. This horizontal relative orientation is indicated by broken lines.

FIG. 3 illustrates a cross-section of the element 2 clamped between the plates 3, 4 of the production apparatus 1 (FIG. 1). The increased hydrostatic pressure in the liquid (photo)polymer 11 induced by compressing the plates 3, 4 of the production apparatus 1 leads to a corresponding deformation of the rear layer 10, which is pushed into the central region 12 of the intermediate piece 8 and in the region outside the outer edge of the intermediate piece 8 against the top plate 4. Surprisingly, it has been found that the deformation of the rear layer 10 of the element 2 caused as a result at least almost totally prevents any creases from forming in the rear layer 10 and in the top layer 9, i.e. in the central region 12. After curing and forming a solid printing plate by radiation, in particular with UV light, the formation of the smooth surfaces on the finished printing plate are therefore obtained with the aid of the intermediate piece 8.

The frame-shaped intermediate piece 8 has a surface-area dimension of a DIN A4 sheet with a thickness 13 (FIG. 2) within a range of 1 mm to 2.5 mm, for example. The cross-section of the frame-shaped intermediate piece 8 also has a frame width 14 (FIG. 2) within a range of 4 mm to 10 mm. For the dimension of the surface ratio of the element 2 and the frame-shaped intermediate piece 8, a peripheral distance within a range of from 15 mm to 25 mm is provided. The intermediate piece 8 is preferably made from Plexiglass but could alternatively also be made from other plastics or metals used for production. In addition to the frame-shaped intermediate piece 8, as illustrated in FIGS. 1 to 3, other shapes could also be used for the intermediate piece 8. For example, the intermediate piece 8 may be provided in the form of a lattice with several open regions, in other words the central region 12 is sub-divided into several part-regions. This may be of advantage if, as is usually the case, several stamp plates are being produced simultaneously using a correspondingly big element 2. The layout of the printing pattern on the photographic negative (mask 7) is then adapted to the lattice pattern of the intermediate piece 8.

With the system of lighting unit respectively a production apparatus 1 described with reference to FIGS. 1 to 3 for curing (photo)polymers, the method proposed by the invention can therefore be used to produce a printing plate for a stamp. As described above, this method takes place using a (photo)polymer pack or photopolymer unit, i.e. the element 2, with a sealed pad comprising a rear layer 10 and a top layer 9, in which a liquid, gel-type or pasty (photo)polymer is contained. In accordance with this method, the element 2 is placed between the two parallel plates 3, 4 of the production apparatus 1 and an intermediate piece 8 is placed on the element 2. The element 2 is compressed together with the intermediate piece 8 lying on it between the plates 3, 4 of the production apparatus 1 and the liquid (photo)polymer 11 respectively the prepolymer is irradiated or illuminated with electromagnetic radiation, in particular UV light, so that it polymerises and a solid printing plate is formed. The intermediate piece 8 is effectively conducive to forming a smooth surface of the solid printing plate. An intermediate piece 8 in the shape of a frame with an open central region 12 is preferably used for the method. The frame-shaped intermediate piece 8 is preferably placed against the rear layer 10 of the element 2 but may also be placed against the top layer 9 as an alternative. The light source(s) 5, 6 respectively the radiation source (s) is/are disposed so that the UV light respectively the electromagnetic radiation passes through at least one of the plates 3, 4 and at least a part of the negative film respectively a part of the mask 7 before it illuminates the liquid (photo)polymer 11.

Figure 4:
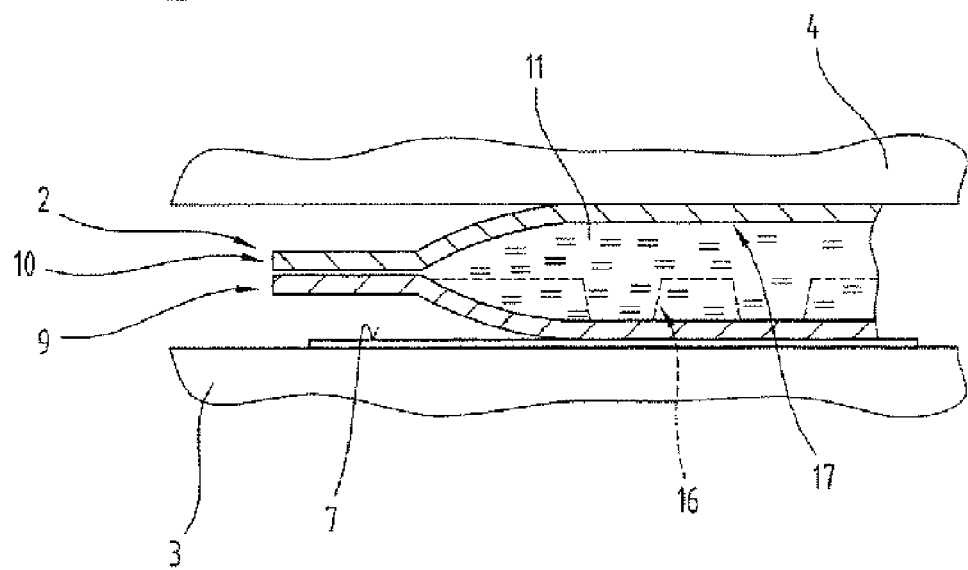
FIG. 4 is a cross-section of an element based on an example of a different embodiment.

Another example of an embodiment of an element 2 for producing a printing plate of a stamp will be described with reference to FIG. 4.

In this diagram, the element 2 is laid together with the mask 7 between the bottom plate 3 and the top plate 4 of the production apparatus 1 (FIG. 1) and is compressed between these plates 3, 4. The mask 7 is disposed lying on the bottom plate 3 so that the element 2 lies with the top layer 9 against the mask 7 and the rear layer 10 of the element 2 lies against the top plate 4.

The top layer 9 of the element 2 based on this example of an embodiment is provided in the form of a cast plastic film. It has been found that cast plastic films disrupt the passage of the radiation to only a minimal degree during the lighting process, thereby enabling a high degree of production accuracy to be obtained when manufacturing the printing plates 16. For the top layer 9, cast plastic films of the following synthetic polymers are used: cellulose nitrate, cellulose acetate, cellulose triacetate, polycarbonate, polyether sulphone, polyether imide, polyvinylidene fluoride, polyimide, polyvinyl alcohol, methyl cellulose, starch derivative or gelatine. Cast films of polyvinyl chloride (PVC) have proved to be particularly suitable for the top layer 9. The thickness of these cast plastic films specifically has a value in a range of between 15 micrometers and 125 micrometers, in particular 25 micrometers to 60 micrometers.

The cast plastic films are produced by pouring plastics solutions out of a wide-slit nozzle onto a rotating drum or an endless metal belt. To this end, the polymer substances are firstly prepared with the aid of a solvent to obtain a plastic solution, which is then applied very thinly to a surface. Once the solvent has evaporated, solidification then takes place, resulting in a thin foil or a thin film. This method is what is known as the solvent cast method.

In one embodiment of the element 2, the rear layer 10 can be detached from the printing plate 16 formed after the lighting or curing process of the (photo)polymer 11. To this end, the element 2 has a rear layer 10 made from a polyethylene film and a top layer 9 made from a cast plastic film, in particular a cast PVC film.

In an example of a different embodiment of the element 2, the rear layer 10 remains adhered to the printing plate 16 (indicated by broken lines) after illuminating and curing the (photo)polymer 11. To this end, the rear layer 10 may have a coating 17 which is applied to its side facing the (photo)polymer 11. A specially coated polyester film is preferably used for the rear layer 10. The material used for the coating 17 is one which imparts good adhesion to the cured (photo)polymer 11 or printing plate 16. The material used for the coating 17 is simultaneously also suitable for ensuring a sufficiently good welding with the top layer 9 and does not dissolve in the liquid (photo)polymer 11. A PVC-polyvinyl acetate copolymer is preferably used for the coating 17, which has proved to be particularly effective.

The plastic films used for the rear layer 10 preferably have a thickness in a range of between 25 micrometers and 150 micrometers, in particular between 50 micrometers and 100 micrometers.

Suitable films for the rear layer 10 may be obtained under the name of Skyrol7. Suitable films for the top layer 9 may be obtained under the name of LXP-453 from VCF Films Inc. Suitable coatings for the rear layer 10 can be obtained from DOW Chemical Company under the name of UCAR7VAGC.

The method proposed by the invention may be used to produce printing plates 16 for the flexo printing method, for manual stamps, so-called art stamps, etc.

The embodiments illustrated as examples represent possible design variants of the element 2 and the method of producing a printing plate 16 and it should be pointed out at this stage that the invention is not specifically limited to the design variants specifically illustrated, and instead the individual design variants may be used in different combinations with one another and these possible variations lie within the reach of the person skilled in this technical field given the disclosed technical teaching. Accordingly, all conceivable design variants which can be obtained by combining individual details of the design variants described and illustrated are possible and fall within the scope of the invention.

For the sake of good order, finally, it should be pointed out that, in order to provide a clearer understanding of the structure of the element 2, it and its constituent parts are illustrated to a certain extent out of scale and/or on an enlarged scale and/or on a reduced scale.

The invention claimed is:

1. A photopolymer unit comprising a rear layer and a top layer joined to one another to form a sealed bag, a photopolymer arranged within the sealed bag adapted to be polymerized by electromagnetic radiation, wherein the top layer is made from a plastic, and the rear layer has a coating of a polymer substance which is disposed in direct contact with the photopolymer, and the coating assists the adhesion of the rear layer to the photopolymer.

2. The photopolymer unit of claim 1, wherein the rear layer contains at least one polyester.

3. The photopolymer unit of claim 1, wherein the polymer substance of the coating contains a PVC-PVA copolymer.

4. The photopolymer unit of claim 1, wherein the plastic of the top layer comprises a cast PVC.

5. The photopolymer unit of claim 1, wherein the rear layer has a thickness selected from a range with a lower limit of 25 μm and an upper limit of 150 μm.

6. The photopolymer unit of claim 5, wherein the rear layer has a thickness selected from a range with a lower limit of 50 μm, and an upper limit of 100 μm.

7. The photopolymer unit of claim 1, wherein the top layer has a thickness selected from a range with a lower limit of 15 μm and an upper limit of 125 μm.

8. The photopolymer unit of claim 7, wherein the top layer has a thickness selected from a range with a lower limit of 25 μm and an upper limit of 60 μm.

\* \* \* \* \*